(12) United States Patent
Mehta

(10) Patent No.: US 6,287,916 B1
(45) Date of Patent: Sep. 11, 2001

(54) METHOD FOR FORMING A SEMICONDUCTOR DEVICE USING LPCVD NITRIDE TO PROTECT FLOATING GATE FROM CHARGE LOSS

(75) Inventor: Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/731,185

(22) Filed: Dec. 7, 2000

(51) Int. Cl.[7] .................................................. H01L 21/336
(52) U.S. Cl. ........................ 438/257; 438/261; 438/303; 438/591
(58) Field of Search ..................................... 438/257, 261, 438/263, 264, 265, 266, 267, 299, 305, 303, 591

(56) References Cited

U.S. PATENT DOCUMENTS

| | | | |
|---|---|---|---|
| 5,885,858 | * 3/1999 | Nishimura et al. | 438/149 |
| 5,940,735 | * 8/1999 | Mehta et al. | 438/783 |
| 6,037,223 | * 3/2000 | Su et al. | 438/257 |
| 6,060,766 | * 5/2000 | Mehta et al. | 257/639 |
| 6,071,784 | * 6/2000 | Mehta et al. | 438/303 |

* cited by examiner

Primary Examiner—Charles Bowers
Assistant Examiner—Jack Chen
(74) Attorney, Agent, or Firm—Davis Chin

(57) ABSTRACT

An improved method of fabricating a non-volatile semiconductor device having a PECVD nitride cap layer formed under a BPTEOS oxide film is provided. The present method utilizes the step of forming a LPCVD nitride film under the PECVD nitride cap layer and over the floating gate so as to protect the floating gate from charge loss.

6 Claims, 1 Drawing Sheet

METHOD FOR FORMING A SEMICONDUCTOR DEVICE USING LPCVD NITRIDE TO PROTECT FLOATING GATE FROM CHARGE LOSS

BACKGROUND OF THE INVENTION

1. Field of the Invention

This invention relates generally to semiconductor processing methods, and more particularly, it relates to a method for manufacturing a non-volatile semiconductor device having a PECVD nitride cap layer which includes a LPCVD barrier layer formed under the cap layer and over the floating gate so as to protect the floating gate from charge loss.

2. Description of the Prior Art

In view of the trend in the semiconductor industry for achieving higher and higher packing densities in integrated circuits, multilayer interconnects are being used to connect the electrical components on two different levels. Typically, a PECVD nitride cap layer is formed underneath a BPTEOS layer which is used as an interlayer dielectric (ILD) between the two different levels. Unfortunately, the PECVD nitride cap layer has a high hydrogen ion content. As is generally known, one of the major concerns in the fabrication of non-volatile memory devices is that of high temperature data retention which is believed to be caused by mobile hydrogen ions. These mobile ions can diffuse to the floating gate in the non-volatile memory devices and cause charge loss.

Traditionally, the prior art semiconductor processing for non-volatile memory devices having a PECVD nitride cap layer formed underneath the BPTEOS oxide films utilized a phosphorus implant into the cap layer followed by a high temperature heat treatment (e.g., RTA) at about 800° C. for removing of the free hydrogen ions. Further, a hydrogen getter layer may be formed over the floating gate so as to order to getter mobile ions that may be present in the semiconductor device and thus obtain good data retention. For a complete discussion of this prior art technique, reference is made to U.S. Pat. No. 5,940,735 issued on Aug. 17,1999 and entitled "Reduction of Charge Loss in Non-volatile Memory Cells by Phosphorus Implantation into PECVD Nitride/Oxynitride Films" which is hereby incorporated in its entirety by reference.

Accordingly, there has arisen a need for a method for manufacturing a non-volatile memory device having a PECVD nitride cap layer which eliminates the phosphorus implant followed the high temperature RTA process, but yet protect the floating gate from charge loss. This is achieved in the present invention by forming a LPCVD nitride film under the PECVD nitride cap layer and over the floating gate so as to protect the floating gate from charge loss.

SUMMARY OF THE INVENTION

Accordingly, it is a general object of the present invention to provide an improved method for fabricating a non-volatile semiconductor device having a PECVD nitride cap layer formed under a BPTEOS film which overcomes the problems of the prior art methods.

It is an object of the present invention to provide an improved method for fabricating a non-volatile semiconductor device having a PECVD nitride cap layer formed under a BPTEOS film which eliminates the phosphorus implant followed by a high temperature RTA process, but yet protect the floating gate from charge loss.

It is another object of the present invention to provide an improved method for fabricating a non-volatile semiconductor device having a PECVD nitride cap layer formed under a BPTEOS film which includes a LPCVD nitride barrier layer disposed between the cap layer and the floating gate.

It is still another object to provide an improved method for fabricating a non-volatile semiconductor device having a PECVD nitride cap layer formed under a BPTEOS film which includes the step of performing a low pressure chemical vapor deposition nitride film at a temperature of about 700 to 800° C. after the formation of the floating gate so as to protect the same from charge loss.

In accordance with a preferred embodiment of the present invention, there is provided an improved method of fabricating a non-volatile semiconductor device having a PECVD nitride cap layer formed under a BPTEOS oxide film. The present method utilizes the step of forming a layer of LPCVD nitride film over the floating gate so as to prevent charge loss. A PECVD nitride cap layer is deposited on top of the layer of LPCVD nitride film over the entire surface of the semiconductor device. A BPTEOS oxide film is deposited on top of the PECVD nitride cap layer over the entire surface of the semiconductor device. A RTA step at a temperature of about 800° C. is performed immediately after the deposition of the BPTEOS film so as to densify and stabilize the same. Then, a CMP step is performed so as to planarize the BPTEOS film.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

The purpose of this invention is to provide an improved method for manufacturing a non-volatile semiconductor device having a PECVD nitride cap layer formed under a BPTEOS oxide film which eliminates the need of a phosphorus implant followed a high temperature RTA process step typically performed at a temperature of about 800° C., but yet protect the floating gate from charge loss. In view of this, the inventor of the instant invention has achieved this result by forming a low pressure chemical vapor deposition nitride film at a temperature of about 700 to 800° C. immediately after the formation of the floating gate so as to protect the same from charge loss. Accordingly, the required modifications to the conventional non-volatile semiconductor device fabrication process are minimal and therefore do not increase significantly the manufacturing costs.

Figure 1:
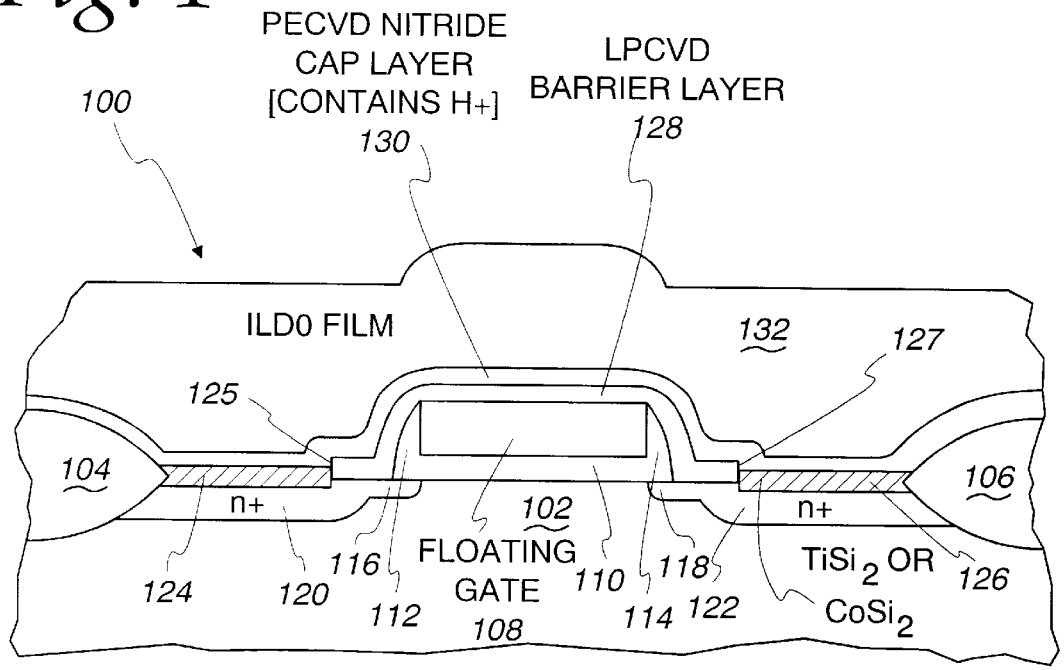
FIG. 1 is a cross-sectional view of a non-volatile semiconductor device manufactured in accordance with the method of the present invention, having a PECVD nitride cap layer deposited thereon but before the formation of an electrical contact.

Referring now in detail to the various views of the drawings, there is shown in FIG. 1 a cross-sectional view of a non-volatile semiconductor device 100 manufactured in accordance with the principles of the present invention wherein a PECVD nitride cap layer and a BPTEOS layer have been deposited but prior to the formation of an electrical contact. As can be seen, the semiconductor device 100 includes a semiconductor substrate 102 on which is formed field oxide regions 104 and 106. As is well known in the art, the field oxide regions 104 and 106 may be formed by a LOCOS (local oxidation on silicon) method. In the alternative, a conventional STI (shallow trench isolation) method may be used so as to produce isolation regions in order to separate the active regions on the semiconductor substrate 102.

The semiconductor device 100 further includes a floating gate 108 such as a polysilicon gate formed on top of gate oxide layer 110 overlying the semiconductor substrate 102. Sidewall spacers 112 and 114 are formed on each side of the floating gate 108. Prior to the formation of the sidewall spacers 112 and 114, lightly-doped drain (LDD) regions 116 and 118 are formed in the semiconductor substrate 102. An n+source region 120 and an n+ drain region 122 are thereafter formed in the semiconductor substrate 102.

A floating gate protection layer 128 is formed over the semiconductor device 100. The protection layer 128 functions as a barrier layer which is formed by a high temperature process (500° C. or greater) and is preferably a layer of LPCVD (low pressure chemical vapor deposition) nitride film. The layer 128 of the LPCVD nitride film is preferably deposited in a furnace at a temperature range of 700–800° C. and thus contains small amounts of hydrogen ions. The layer 128 has a thickness in the range of about 500–2000 Å and is preferably about 1000 Å. Further, the barrier layer 128 is etched at areas 125 and 127 so as to allow a salicide layer to form in the areas not protected by the LPCVD nitride film.

A source salicide layer 124 is formed on the top surface of the source region 120, and a drain salicide layer 126 is formed on the top surface of the drain region 122. The salicide layers 124 and 126 are preferably formed of titanium silicide ($TiSi_2$) or cobalt silicide ($CoSi_2$), as is well to those skilled in the art of semiconductor manufacturing.

Since the layer 128 of LPCVD nitride film is deposited before the salicide formation, it will not degrade the silicide layers 124 and 126. After the formation of the salicide layers, a cap layer 130 on top of the barrier layer 128 over the entire surface of the semiconductor device 100. The cap layer 130 is formed by a high temperature process (500° C. or greater) and is typically a layer of PECVD (plasma enhanced chemical vapor deposition) nitride film which contains free hydrogen ions. The thickness of the cap layer 130 is about 800 Å. Then, an interlayer dielectric 132 is deposited on top of the cap layer 130 over the entire surface of the semiconductor device. The interlayer dielectric is preferably formed of a BPTEOS (borophosphorus-doped tetraethylorthosilicate)deposited oxide film. The thickness of the layer 132 is on the order of 12,000 Å or greater.

Thereafter, a rapid thermal annealing (RTA) step at a temperature of about 800° C. for a duration of approximately 1 minute is performed immediately after the deposition of the BPTEOS film so as to densify and stabilize the same. Next, after the RTA step the BPTEOS film is planarized to a final thickness of about 8000 Å by using a chemical-mechanical polishing (CMP) step. This resultant semiconductor structure is illustrated in FIG. 2.

Figure 2:
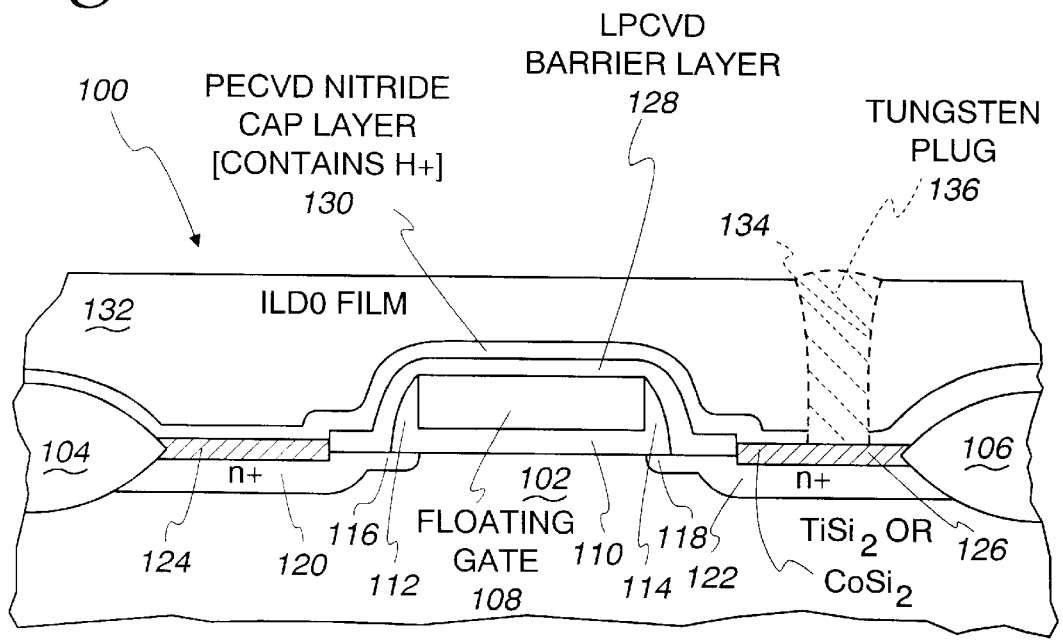
FIG. 2 is a cross-sectional view similar to FIG. 1, but after the electrical contact is performed.

After the polishing step, as is shown in the dotted lines of FIG. 2 a conventional electrical contact is formed by subsequent processing of the semiconductor structure. In particular, the BPTEOS layer 132 is etched so as to create a channel 134 therein so as to expose the drain salicide layer 126. Thereafter, the channel 134 is filled with a tungsten plug 136 utilizing a conventional CVD process for producing an electrical interconnection between the drain salicide layer 126 and selected portion of any component formed above the BPTEOS layer 132 of the semiconductor device 100.

From the foregoing detailed description, it can thus be seen that the present invention provides an improved method for fabricating a non-volatile semiconductor device having a PECVD nitride cap layer formed under a BPTEOS oxide film. The present method utilizes the step forming a LPCVD nitride film under the PECVD nitride cap layer and over the floating gate so as to protect the floating gate from charge loss.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of fabricating a non-volatile semiconductor device, comprising the steps of:

forming a gate oxide on a semiconductor substrate;

forming a floating gate on top of the gate oxide;

forming sidewall spacers on each side of the floating gate;

forming source/drain regions on opposite sides of the sidewall spacers in the semiconductor substrate;

forming a layer of LPCVD nitride film over the floating gate and over portion of said source/drain regions;

forming a salicide layer on top of the source/drain regions;

depositing a PECVD nitride cap layer directly on top of the layer of the LPCVD nitride film over an entire surface of the semiconductor device;

depositing an interlayer dielectric on top of the PECVD nitride cap layer over the entire surface of the semiconductor device;

annealing the interlayer dielectric at a temperature of about 800° C. so as to densify and stabilize the interlayer dielectric; and chemical-mechanical polishing of the interlayer dielectric so as to planarize the interlayer dielectric.

2. A method of fabricating a non-volatile semiconductor device as claimed in claim 1, wherein the interlayer dielectric is comprised of a BPTEOS oxide film which is deposited to a thickness of about 12000 Å.

3. A method of fabricating a non-volatile semiconductor device as claimed in claim 2, wherein the step of chemical-mechanical polishing causes the BPTEOS oxide film to be planarized to final thickness of about 8000 Å.

4. A method of fabricating a non-volatile semiconductor device as claimed in claim 1, further comprising the step of forming a channel in the interlayer dielectric after the interlayer dielectric has been planarized so to expose the salicide layer overlying one of the source/drain regions and filling the channel with a tungsten plug so as to define an electrical contact.

5. A method of fabricating a non-volatile semiconductor device as claimed in claim 1, wherein the layer of LPCVD nitride film is deposited in a furnace at a temperature range of 700–800° C.

6. A method of fabricating a non-volatile semiconductor device as claimed in claim 5, wherein the layer of LPCVD nitride film has a thickness of about 1000–2000 Å.

* * * * *